(12) United States Patent
Ide et al.

(10) Patent No.: US 9,207,264 B2
(45) Date of Patent: Dec. 8, 2015

(54) CURRENT SENSOR

(71) Applicant: ALPS GREEN DEVICES CO., LTD., Tokyo (JP)

(72) Inventors: Yosuke Ide, Niigata-ken (JP);
Masamichi Saito, Niigata-ken (JP);
Akira Takahashi, Niigata-ken (JP);
Masahiro Iizuka, Niigata-ken (JP);
Kenji Ichinohe, Niigata-ken (JP);
Yoshihiro Nishiyama, Niigata-ken (JP);
Mitsuo Aratono, Niigata-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 259 days.

(21) Appl. No.: 13/910,009

(22) Filed: Jun. 4, 2013

(65) Prior Publication Data

US 2013/0265040 A1  Oct. 10, 2013

Related U.S. Application Data

(63) Continuation of application No. PCT/JP2012/050089, filed on Jan. 5, 2012.

(30) Foreign Application Priority Data

Jan. 11, 2011 (JP) .................................. 2011-003160

(51) Int. Cl.
*G01R 33/02* (2006.01)
*G01R 33/09* (2006.01)
*G01R 15/20* (2006.01)
*H01L 27/22* (2006.01)
*H01L 43/08* (2006.01)
*H01F 10/32* (2006.01)
*B82Y 25/00* (2011.01)

(52) U.S. Cl.
CPC ............ *G01R 15/205* (2013.01); *G01R 33/093* (2013.01); *H01F 10/3272* (2013.01); *H01L 27/22* (2013.01); *H01L 43/08* (2013.01); *B82Y 25/00* (2013.01); *G01R 33/09* (2013.01)

(58) Field of Classification Search
CPC ........................... G01R 15/205; G01R 33/093
USPC .............................................. 324/207.21, 252
See application file for complete search history.

(56) References Cited

U.S. PATENT DOCUMENTS 4,937,521 A   6/1990   Yoshino et al.
6,387,548 B1  5/2002   Hasegawa et al.

(Continued)

OTHER PUBLICATIONS

Search Report dated Apr. 17, 2012 from International Application No. PCT/JP2012/050089.

*Primary Examiner* — Reena Aurora
(74) *Attorney, Agent, or Firm* — Beyer Law Group LLP

(57) ABSTRACT

A current sensor includes a substrate, a conductive body being provided above the substrate and extending in one direction, and magnetoresistance effect elements being provided between the substrate and the conductive body and outputting output signals owing to an induction magnetic field from a current to be measured being conducted through the conductive body, wherein each of the magnetoresistance effect elements has a laminated structure including a ferromagnetic fixed layer whose magnetization direction is fixed, a non-magnetic intermediate layer, and a free magnetic layer whose magnetization direction fluctuates with respect to an external magnetic field, the ferromagnetic fixed layer is a self-pinned type formed by antiferromagnetically coupling a first ferromagnetic film and a second ferromagnetic film through an antiparallel coupling film, the Curie temperatures of the first ferromagnetic film and the second ferromagnetic film are approximately equal, and a difference between the magnetization amounts thereof is substantially zero.

5 Claims, 6 Drawing Sheets

(56) References Cited

U.S. PATENT DOCUMENTS

| | | |
|---|---|---|
| 7,723,984 B2 | 5/2010 | Shoji et al. |
| 8,487,612 B2 * | 7/2013 | Ichinohe et al. ............ 324/252 |
| 2006/0012459 A1 | 1/2006 | Lenssen |
| 2010/0327857 A1 | 12/2010 | Hoshiya et al. |

* cited by examiner

CURRENT SENSOR

CLAIM OF PRIORITY

This application is a Continuation of International Application No. PCT/JP2012/050089 filed on Jan. 5, 2012, which claims benefit of Japanese Patent Application No. 2011-003160 filed on Jan. 11, 2011. The entire contents of each application noted above are hereby incorporated by reference.

BACKGROUND OF THE INVENTION

1. Field of the Invention

The present invention relates to a current sensor for measuring the magnitude of an electric current, and relates to, for example, a current sensor including a magnetoresistance effect element (a TMR element or a GMR element).

2. Description of the Related Art

In the past, in a field such as a technology for driving motors in electric vehicles, hybrid vehicles, and the like, a current sensor has been desired that is capable of measuring the driving current of a motor in a non-contact manner. As such a current sensor, a current sensor has been proposed that uses a magnetoresistance effect element outputting an output signal owing to an induction magnetic field from a current to be measured. Such a technique has been disclosed in, for example, U.S. Pat. No. 6,387,458.

A current sensor disclosed in U.S. Pat. No. 6,387,458 includes a GMR element, as the magnetoresistance effect element. The basic film configuration of the GMR element includes an antiferromagnetic layer, a ferromagnetic fixed layer, a non-magnetic material layer, and a free magnetic layer. The ferromagnetic fixed layer is formed on the antiferromagnetic layer so as to be in contact therewith, and owing to an exchange coupling magnetic field (Hex) occurring between the ferromagnetic fixed layer and the antiferromagnetic layer, the magnetization direction of the ferromagnetic fixed layer is fixed in one direction. The free magnetic layer is laminated with the non-magnetic material layer (non-magnetic intermediate layer) sandwiched between the free magnetic layer and the ferromagnetic fixed layer, and the magnetization direction of the free magnetic layer is changed owing to an external magnetic field. In the current sensor including the GMR element, the current value of a current to be measured is detected using the electrical resistance value of the GMR element, which fluctuates owing to a relationship between the magnetization direction of the free magnetic layer, which changes owing to the application of an induction magnetic field from the current to be measured, and the magnetization direction of the ferromagnetic fixed layer.

SUMMARY OF THE INVENTION

In recent years, it has been desired that a current sensor is further downsized and the measurement accuracy thereof is improved. So as to downsize a current sensor, a current drawing type current sensor has been studied that draws a current to be measured into a conductive body pattern provided above a base material and measures the current to be measured.

FIG. 7 illustrates an example of the current drawing type current sensor. Such a current sensor 100 includes a U-shaped conductive body 102 provided above a substrate 101, GMR elements 103a and 103b provided in one end portion of the conductive body 102, and GMR elements 103c and 103d provided in another end portion of thereof. The sensitivity axis directions of the four GMR elements 103a to 103d are aligned in the same direction (refer to an arrow in FIG. 7), and the four GMR elements 103a to 103d configure a magnetic field detection bridge circuit. In this current sensor, in the one end portion and the other end portion of the U-shaped conductive body 102, induction magnetic fields applied from directions opposite to each other are detected through the four GMR elements 103a to 103d.

In the current drawing type current sensor 100, since a current to be measured is measured through the magnetic field detection bridge circuit, it is necessary to set, to directions different from each other, the applying direction of the induction magnetic field applied to the GMR elements 103a and 103b in the one end portion of the conductive body 102 and the applying direction of the induction magnetic field applied to the GMR elements 103c and 103d in the other end portion of the conductive body 102. Therefore, in the current drawing type current sensor 100, the conductive body 102 is caused to have a U-shape, the current to be measured is conducted from the one end portion of the conductive body 102 to the other end portion thereof, and hence, the applying direction of the induction magnetic field applied to the GMR elements 103a and 103b and the applying direction of the induction magnetic field applied to the GMR elements 103c and 103d are controlled so as to be directions opposite to each other.

However, in the above-mentioned current drawing type current sensor 100, since it is necessary to form the conductive body 102 in the U-shape, there occurs a problem that the downsizing of the current sensor 100 is restricted. In addition, since the current to be measured is conducted through the conductive body pattern 102 inflected in the U-shape, induction magnetic fields occur from different directions. Therefore, there has occurred a problem that interference with the induction magnetic fields occur and measurement accuracy is reduced.

In view of such a point, the present invention is made, and provides a current sensor capable of extensively and precisely measuring a current to be measured and being downsized.

The present invention provides a current sensor including a substrate, a conductive body being provided above the substrate and extending in one direction, and at least two magnetoresistance effect elements being arranged in parallel between the substrate and the conductive body and outputting an output signal owing to an induction magnetic field from a current to be measured being conducted through the conductive body, wherein each of the magnetoresistance effect elements has a laminated structure including a ferromagnetic fixed layer whose magnetization direction is fixed, a non-magnetic intermediate layer, and a free magnetic layer whose magnetization direction fluctuates with respect to an external magnetic field, the ferromagnetic fixed layer is a self-pinned type formed by antiferromagnetically coupling a first ferromagnetic film and a second ferromagnetic film through an antiparallel coupling film, the Curie temperatures of the first ferromagnetic film and the second ferromagnetic film are approximately equal, and a difference between magnetization amounts thereof is substantially zero.

According to this configuration, since it may be possible to fix, in arbitrary directions, the magnetization directions of the ferromagnetic fixed layers of the magnetoresistance effect elements without using an exchange coupling magnetic field with an antiferromagnetic layer, even if a plurality of magnetoresistance effect elements are arranged in parallel above a substrate, it may be possible to fix, in an arbitrary direction, the magnetization direction of the ferromagnetic fixed layer of each magnetoresistance effect element. Accordingly, even if a conductive body extending in one direction is used, it may become possible to measure a current to be measured. Therefore, it may be possible to reduce the area of the substrate, and it may be possible to realize the downsizing of the current sensor and the reduction of a manufacturing cost. In addition, since the current to be measured is conducted through the conductive body extending in one direction, the applying directions of induction magnetic fields are aligned. Therefore, it may be possible to suppress the interference of an induction magnetic field from the current to be measured, and it may be possible to suppress the occurrence of an induced electromotive force with respect to a disturbance magnetic field. Accordingly, it may be possible to improve the measurement accuracy and the measurement range of the current sensor. Therefore, it may be possible to realize a current sensor capable of extensively and precisely measuring a current to be measured and being downsized.

It is desirable that the current sensor of the present invention includes a magnetic field detection bridge circuit configured to include at least the two magnetoresistance effect elements in which the magnetization directions of the ferromagnetic fixed layers are fixed so as to be antiparallel to each other, the magnetic field detection bridge circuit including two outputs producing a voltage difference corresponding to the induction magnetic field, wherein the current to be measured is measured owing to the voltage difference output from the magnetic field detection bridge circuit in accordance with the induction magnetic field.

It is desirable that the current sensor of the present invention includes a magnetic field detection bridge circuit configured to include a pair of magnetoresistance effect elements in which the magnetization directions of the ferromagnetic fixed layers are fixed so as to be antiparallel to each other and a pair of magnetoresistance effect elements in which the magnetization directions of the ferromagnetic fixed layers are fixed in directions opposite to the former pair of magnetoresistance effect elements, the magnetic field detection bridge circuit including two outputs producing a voltage difference corresponding to the induction magnetic field, wherein the current to be measured is measured owing to the voltage difference output from the magnetic field detection bridge circuit in accordance with the induction magnetic field.

DESCRIPTION OF THE PREFERRED EMBODIMENTS

In a current sensor, it is desired that the current sensor is further downsized and measurement accuracy and a measurement range are improved. In the current sensor, a current drawing type current sensor is adopted where a conductive body conducting therethrough a current to be measured and a magnetoresistance effect element are laminated on or above a substrate, and hence, the downsizing of the current sensor becomes available.

On the other hand, when, in the current drawing type current sensor, a magnetoresistance effect element is used that fixes the magnetization direction of a fixed magnetic layer owing to an exchange coupling magnetic field with an antiferromagnetic layer, it may be necessary to perform heat treatment in a magnetizing field (annealing treatment) in the manufacturing process thereof. Therefore, when a plurality of magnetoresistance effect elements are provided above a base material, the magnetization directions of the ferromagnetic fixed layers of the individual magnetoresistance effect elements turn out to be aligned in the same direction. When, in the current drawing type current sensor, using a bridge circuit configured by the plural magnetoresistance effect elements whose magnetization directions are aligned in the same direction, the current to be measured is measured, it may be necessary to inflect the conductive body and apply an induction magnetic field to the individual magnetoresistance effect elements from different directions.

Figure 5A:
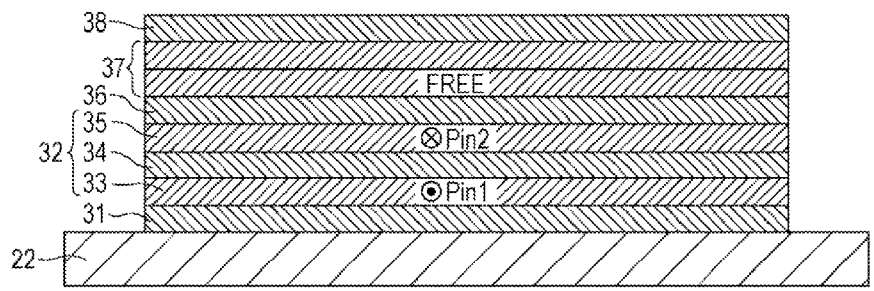
FIGS. 5A to 5C are explanatory diagrams for a manufacturing method for a current sensor according to an embodiment of the present invention.
Figure 5B:
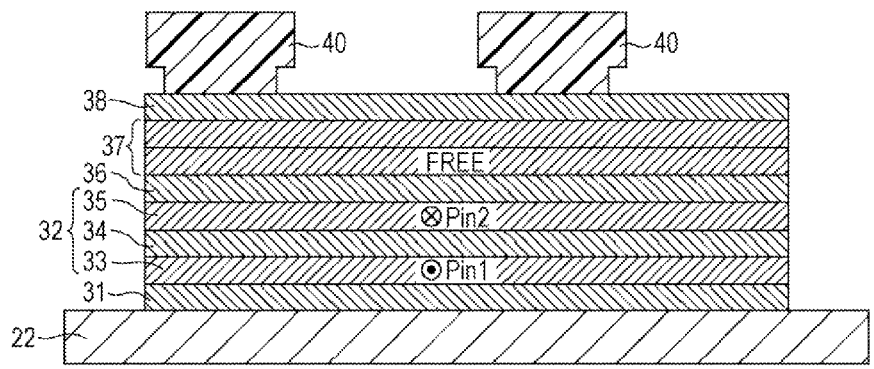
Figure 5C:
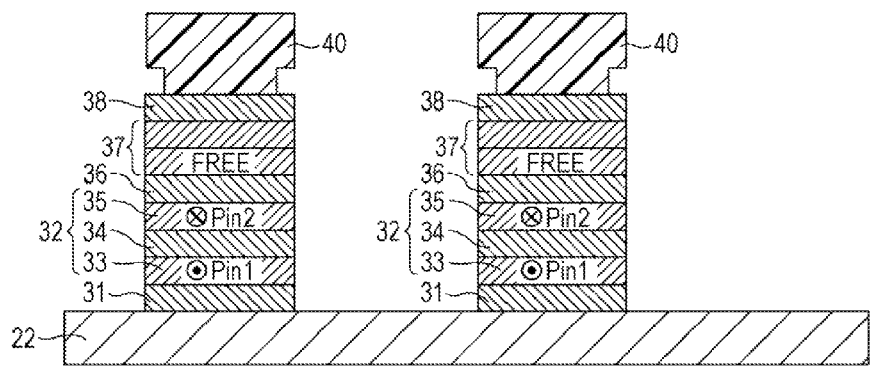

The present inventors focused attention on a self-pinned type magnetoresistance effect element capable of fixing the magnetization direction of the ferromagnetic fixed layer without using an antiferromagnetic layer. Here, as illustrated in FIGS. 5A to 5C, a self-pinned type structure means a structure that has a laminated structure including a ferromagnetic fixed layer 32, a non-magnetic intermediate layer 36, and a free magnetic layer 37 and which has no antiferromagnetic layer under the ferromagnetic fixed layer 32. The ferromagnetic fixed layer 32 includes a first ferromagnetic film 33, an antiparallel coupling film 34, and a second ferromagnetic film 35, and the second ferromagnetic film 35 faces the non-magnetic intermediate layer 36. The self-pinned type magnetoresistance effect element is used for the current drawing type current sensor, and hence, it may become possible to fix, in arbitrary directions, the magnetization directions of the ferromagnetic fixed layers of the plural magnetoresistance effect elements provided on or above a substrate.

The present inventors found that, in a current drawing type current sensor drawing a current to be measured into a conductive body pattern on or above a substrate, even if the current to be measured is conducted through the conductive body extending in one direction, it may become possible to measure the current to be measured, using a self-pinned type magnetoresistance effect element. In addition, the present inventors found that, in the current drawing type current sensor, using the conductive body extending in one direction, it may be possible to reduce the size of the substrate and it may become possible to downsize the current sensor, that it may be possible to reduce the interference of an induction magnetic field and improve measurement accuracy, and that it may be possible to suppress an induced electromotive force with respect to an external magnetic field, and the present inventors resulted in completing the present invention.

Hereinafter, an embodiment of the present invention will be described in detail with reference to accompanying drawings.

Figure 1:
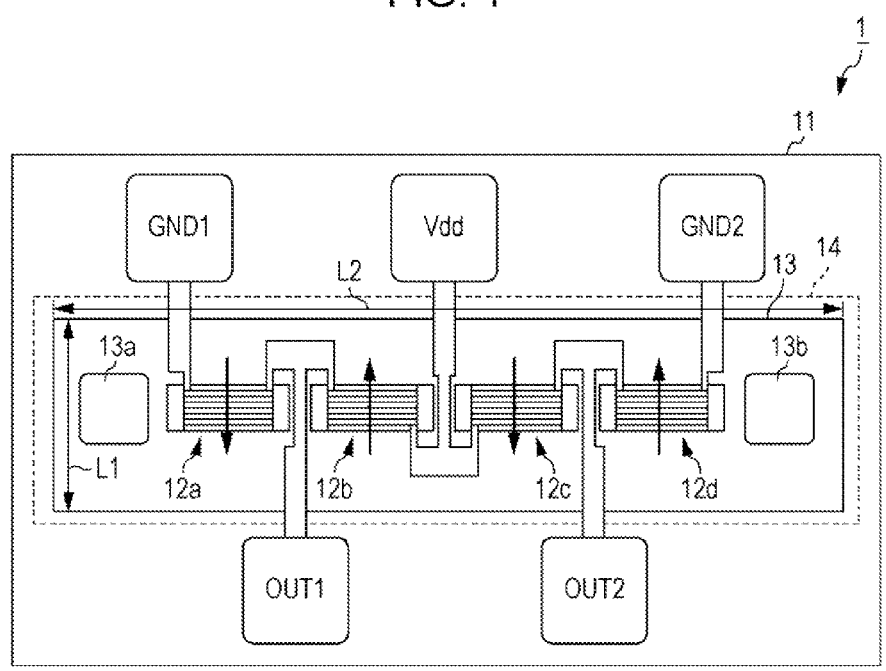
FIG. 1 is a plan pattern diagram of a current sensor according to an embodiment of the present invention.

FIG. 1 is the plan pattern diagram of a current sensor 1 according to an embodiment of the present invention. As illustrated in FIG. 1, the current sensor 1 according to an embodiment of the present invention includes a substrate 11, four magnetoresistance effect elements 12a to 12d arranged in parallel above the substrate 11, and a conductive body 13 laminated over the magnetoresistance effect elements 12a to 12d through an insulation layer. The conductive body 13 is provided so as to extend in one direction and in approximately the same direction as a direction in which the magnetoresistance effect elements 12a to 12d are arranged in parallel, and electrode pads 13a and 13b drawing a current to be measured from the outside are provided in both end portions of the conductive body 13.

The magnetoresistance effect elements 12a to 12d are provided so as to overlap with the conductive body 13 in the extending direction of the conductive body 13. In addition, the four magnetoresistance effect elements 12a to 12d are provided so that the magnetization direction of the second ferromagnetic film 35a (not illustrated in FIG. 1, and refer to FIG. 3) of a pair of the magnetoresistance effect elements 12a and 12c and the magnetization direction of the second ferromagnetic film 35a (not illustrated in FIG. 1, and refer to FIG. 3) of a pair of the magnetoresistance effect elements 12b and 12d are antiparallel to each other (directions different by 180 degrees). In addition, in FIG. 1, arrows assigned to the magnetoresistance effect elements 12a to 12d indicate the magnetization directions of the second ferromagnetic films 35a (not illustrated in FIG. 1, and refer to FIG. 3) of the magnetoresistance effect elements 12a to 12d.

It is desirable that the magnetoresistance effect elements 12a to 12d are GMR elements having shapes (meander shapes) obtained by a plurality of belt-like elongated patterns (stripes) being folded that are disposed so that the longitudinal directions thereof are parallel to one another.

In the current sensor 1 according to the present embodiment, using a magnetic field detection bridge circuit including the four magnetoresistance effect elements 12a to 12d, the current to be measured is measured that is drawn from the outside through the electrode pads 13a and 13b and conducted through the conductive body 13 in one direction.

In addition, the current sensor 1 includes a magnetic shield 14 (not illustrated in FIG. 1, and refer to FIG. 2) laminated over the conductive body 13 through an insulation layer. The magnetic shield 14 reduces external magnetic fields the magnetoresistance effect elements 12a and 12b receive. In addition, if being a current sensor capable of obtaining a voltage approximately proportional to an induction magnetic field from the current to be measured, the current sensor 1 is not limited to a current sensor including the magnetic field detection bridge circuit.

Next, the connection of the current sensor 1 illustrated in FIG. 1 will be described. In the magnetic field detection bridge circuit illustrated in FIG. 1, a power supply electric potential (Vdd) is applied to one terminal of each of the magnetoresistance effect element 12b and the magnetoresistance effect element 12c, and ground potentials (GND1 and GND2) are applied to one terminal of the magnetoresistance effect element 12a and one terminal of the magnetoresistance effect element 12d, respectively. In addition, the other terminal of the magnetoresistance effect element 12a and the other terminal of the magnetoresistance effect element 12b are connected to each other to serve as a first output (Out1), and the other terminal of the magnetoresistance effect element 12c and the other terminal of the magnetoresistance effect element 12c are connected to each other to serve as a second output (Out2).

Since each of the magnetoresistance effect elements 12a to 12d has a characteristic that the resistance value thereof changes owing to the application of an induction magnetic field H from a current Ito be measured, the first output (Out1) and the second output (Out2) change in response to the induction magnetic field H from the current I to be measured. A potential difference between the first output (Out1) and the second output (Out2) is approximately proportional to the induction magnetic field, and the corresponding potential difference (voltage) becomes the output of the current sensor 1. In addition, the configuration of the bridge circuit is not limited to this. For example, owing to the combination of one magnetoresistance effect element and three fixed resistance elements, a magnetic field detection bridge circuit may also be configured, and, owing to the combination of four magnetoresistance effect elements, a magnetic field detection bridge circuit may also be configured.

Figure 2:
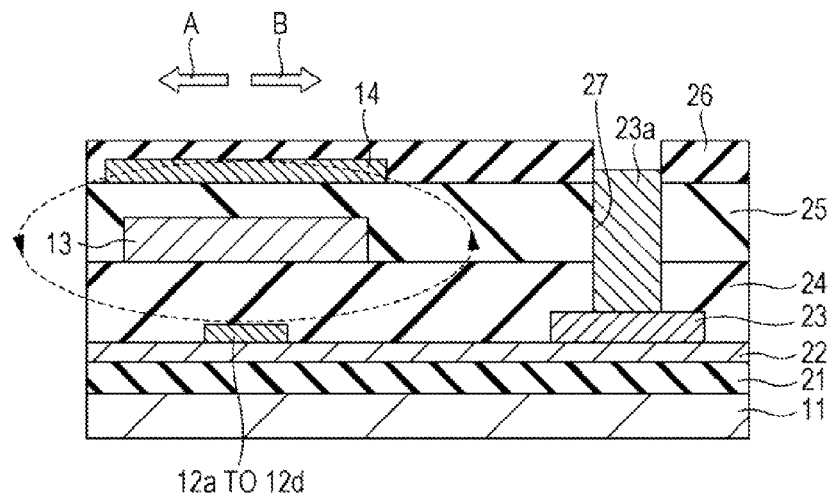
FIG. 2 is a cross-sectional pattern diagram of a current sensor according to an embodiment of the present invention.

FIG. 2 is the cross-sectional pattern diagram of the current sensor 1 illustrated in FIG. 1. As illustrated in FIG. 2, in the current sensor 1 according to the present embodiment, the magnetic field detection bridge circuit (the magnetoresistance effect elements 12a to 12d), the conductive body 13, and the magnetic shield 14 are laminated above the same substrate 11.

Next, the laminated structure of the current sensor 1 will be described in detail. In the current sensor 1 illustrated in FIG. 2, a thermal silicon oxide film 21 serving as an insulation layer is formed on the substrate 11. An aluminum oxide film 22 is formed on the thermal silicon oxide film 21. The aluminum oxide film 22 may be film-formed, using a method such as, for example, sputtering. In addition, as the substrate 11, a silicon substrate or the like may be used.

On the aluminum oxide film 22, the magnetoresistance effect elements 12a to 12d are formed, and the magnetic field detection bridge circuit is formed. As the magnetoresistance effect elements 12a to 12d, TMR elements (tunnel-type magnetoresistance effect elements), GMR elements (giant magnetoresistance effect elements), or the like may be used.

In addition, on the aluminum oxide film 22, an electrode 23 is formed. The electrode 23 may be formed owing to photolithography and etching after an electrode material has been film-formed. In addition, on the electrode 23, an electrode pad 23a is formed.

On the aluminum oxide film 22 in which the magnetoresistance effect elements 12a to 12d and the electrode 23 are formed, a polyimide layer 24 is formed as an insulation layer. The polyimide layer 24 may be formed by applying and hardening a polyimide material.

On the polyimide layer 24, the conductive body 13 is formed through which a current to be measured is to be conducted. The conductive body 13 may be formed owing to photolithography and plating after a base material has been film-formed owing to a sputtering method or the like.

Over the conductive body 13, the magnetic shield 14 is provided through a polyimide layer 25 serving as an insulation layer. As a material used for configuring the magnetic shield 14, a high magnetic permeability material such as an amorphous magnetic material, a permalloy-based magnetic material, or an iron-based microcrystalline material may be used. The magnetic shield 14 absorbs a disturbance magnetic field to the magnetoresistance effect elements 12a to 12d. On the magnetic shield 14, a silicon oxide film 26 is formed. The silicon oxide film 26 may be film-formed owing to a method such as, for example, sputtering.

A contact hole 27 is formed in predetermined regions of the polyimide layer 25 and the silicon oxide film 26 (the region of the electrode 23), and the electrode pad 23a is formed in that contact hole 27. Photolithography and etching, or the like may be used for the formation of the contact hole 27. The electrode pad 23a may be formed owing to photolithography and plating after an electrode material has been film-formed.

In the current sensor having such a configuration as described above, as illustrated in FIG. 2, an induction magnetic field A occurring from the current I to be measured is measured by the magnetoresistance effect elements 12a to 12d.

The current sensor 1 having the above-mentioned configuration uses a magnetic field detection bridge circuit including a magnetoresistance effect element, in particular, a GMR element or a TMR element, as a magnetic detecting element. Accordingly, it may be possible to realize the highly-sensitive current sensor 1. In addition, since, in this current sensor 1, a magnetic detection bridge circuit is configured owing to the four magnetoresistance effect elements 12a to 12d whose film configurations are the same, it may be possible to greatly reduce the shift of a zero-magnetizing field resistance value (R0) or a temperature coefficient resistivity (TCR0) between elements. Therefore, it may be possible to reduce the variation of a midpoint potential regardless of an ambient temperature, and it may be possible to perform current measurement with a high degree of accuracy. In addition, since the conductive body 13, the magnetic shield 14, and the magnetic field detection bridge circuit (the magnetoresistance effect elements 12a to 12d) are formed above the same substrate, and hence the current sensor 1 having the above-mentioned configuration is formed, it may be possible to achieve downsizing. Furthermore, since this current sensor 1 has a configuration including no magnetic core, it may be possible to achieve downsizing and the reduction of a cost.

Figure 3:
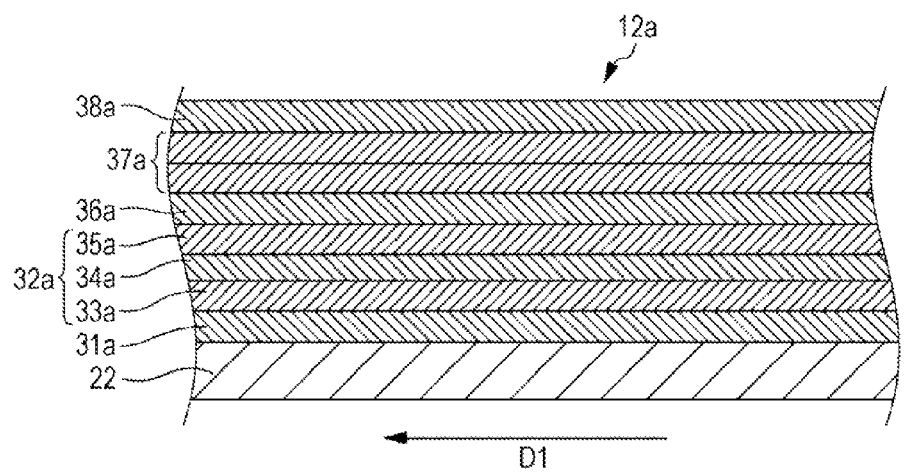
FIG. 3 is a cross-sectional pattern diagram illustrating a laminated structure of a magnetoresistance effect element in a current sensor according to an embodiment of the present invention.

Next, the laminated structure of the current sensor 1 according to the present embodiment will be described with reference to FIG. 3. FIG. 3 is a cross-sectional pattern diagram illustrating the laminated structure of each of the magnetoresistance effect elements 12a to 12d in the current sensor 1 according to an embodiment of the present invention.

As illustrated in FIG. 3, the magnetoresistance effect element 12a is laminated on the aluminum oxide film 22. A seed layer 31a, a ferromagnetic fixed layer 32a (a first ferromagnetic film 33a, an antiparallel coupling film 34a, and the second ferromagnetic film 35a), a non-magnetic intermediate layer 36a, a free magnetic layer 37a, and a protective layer 38a are laminated in this order, and hence, the magnetoresistance effect element 12a is configured. In addition, while the laminated structure of the magnetoresistance effect element 12a is illustrated in FIG. 3, the magnetoresistance effect elements 12b to 12d also have the same laminated structure.

The seed layer 31a is configured owing to NiFeCr, Cr, or the like. The protective layer 38a is configured owing to Ta or the like. In addition, in the above-mentioned laminated structure, between the aluminum oxide film 22 and the seed layer 31a, a base layer may also be provided that is configured owing to a non-magnetic material such as, for example, at least one element of Ta, Hf, Nb, Zr, Ti, Mo, and W.

In this magnetoresistance effect element 12a, the first ferromagnetic film 33a and the second ferromagnetic film 35a are antiferromagnetically coupled to each other through the antiparallel coupling film 34a, and the so-called self-pinned type ferromagnetic fixed layer 32a (a synthetic ferri pinned layer: SFP) is configured. In this way, the self-pinned type (bottom-spin-value) magnetoresistance effect element 12a is configured, and hence, in the manufacturing process of the magnetoresistance effect element 12a, annealing in a magnetizing field, used for fixing the magnetization direction of the ferromagnetic fixed layer 32a and necessary in a magnetoresistance effect element of the related art, may become unnecessary, and it may be possible to maintain induced magnetic anisotropy in a stripe longitudinal direction D1, assigned in the film formation of the free magnetic layer 37a. Accordingly, it may become possible to reduce a hysteresis with respect to a detection target direction. In addition, the magnetization directions of the first ferromagnetic film 33a and the second ferromagnetic film 35a configuring the above-mentioned ferromagnetic fixed layer 32a may also be equal to each other, and may also cancel out each other.

In this ferromagnetic fixed layer 32a, the thickness of the antiparallel coupling film 34a is set to 0.3 nm to 0.45 nm or 0.75 nm to 0.95 nm, and hence, it may be possible to produce strong antiferromagnetic coupling between the first ferromagnetic film 33a and the second ferromagnetic film 35a.

The magnetization amount (Ms·t) of the first ferromagnetic film 33a and the magnetization amount (Ms·t) of the second ferromagnetic film 35a are substantially equal to each other. In other words, a difference between magnetization amounts becomes substantially zero between the first ferromagnetic film 33a and the second ferromagnetic film 35a. Therefore, the effective anisotropy magnetic field of the ferromagnetic fixed layer 32a is large. Accordingly, without using an antiferromagnetic material, it may be possible to sufficiently secure the magnetization stability of the ferromagnetic fixed layer 32a. The reason is that when it is assumed that the film thickness of the first ferromagnetic film 33a is t1, the film thickness of the second ferromagnetic film 35a is t2, and magnetization and an induced magnetic anisotropy constant per unit volume in both of the layers are Ms and K, respectively, the effective anisotropy magnetic field of the SFP layer is expressed in accordance with the following Relational Expression (1). Accordingly, the magnetoresistance effect elements 12a to 12d used in the current sensor 1 according to the present embodiment have film configurations including no antiferromagnetic layer.

$$\mathit{eff}\,Hk = 2(K\cdot t1 + K\cdot t2)/(Ms\cdot t1 - Ms\cdot t2) \qquad \text{Expression (1)}$$

The Curie temperature (Tc) of the first ferromagnetic film 33a and the Curie temperature (Tc) of the second ferromagnetic film 35a are approximately equal to each other. Accordingly, in a high-temperature environment, a difference between the magnetization amounts (Ms·t) of the first ferromagnetic film 33a and the second ferromagnetic film 35a also becomes approximately zero, and it may also be possible to maintain high magnetization stability.

It is desirable that the first ferromagnetic film 33a is configured using CoFe alloy including Fe of 40 atomic percent to 80 atomic percent. The reason is that CoFe alloy having this composition range has a large coercive force and it may be possible to stably maintain magnetization with respect to an external magnetizing field. In addition, it is desirable that the second ferromagnetic film 35 is configured using CoFe alloy including Fe of 0 atomic percent to 40 atomic percent. The reason is that CoFe alloy having this composition range has a small coercive force and it may become easy to be magnetized in a direction (direction different by 180 degrees) antiparallel to a direction in which the first ferromagnetic film 33a is preferentially magnetized. As a result, it may be possible to make the Hk illustrated in the above-mentioned Relational Expression (1) larger. In addition, the second ferromagnetic film 35 is limited to this composition range, and hence, it may be possible to make the resistance change rate of the magnetoresistance effect element 12a large.

It is desirable that, in the first ferromagnetic film 33a and the second ferromagnetic film 35a, a magnetizing field is applied in the stripe width direction of the meander shape during the film formation thereof and induced magnetic anisotropy is assigned to the first ferromagnetic film 33a and the second ferromagnetic film 35a after the film formation. Accordingly, the first ferromagnetic film 33a and the second ferromagnetic film 35a turn out to be antiparallelly magnetized in the stripe width direction. In addition, the magnetization directions (directions in which magnetization is fixed) of the first ferromagnetic film 33a and the second ferromagnetic film 35a are decided on the basis of the magnetizing field applying direction of the first ferromagnetic film 33a during the film formation. Therefore, by changing the magnetizing field applying direction of the first ferromagnetic film 33a during the film formation, it may be possible to form, above the same substrate, a plurality of magnetoresistance effect elements having ferromagnetic fixed layers whose magnetization directions are different.

The antiparallel coupling film 34a of the ferromagnetic fixed layer 32a is configured using Ru or the like. In addition, the free magnetic layer (free layer) 37a is configured using a magnetic material such as CoFe alloy, NiFe alloy, or CoFeNi alloy. In addition, the non-magnetic intermediate layer 36a is configured using Cu or the like. In addition, it is desirable that, in the free magnetic layer 37a, a magnetizing field is applied in the stripe longitudinal direction D1 during the film formation thereof and induced magnetic anisotropy is assigned to the free magnetic layer 37a after the film formation. Accordingly, in the magnetoresistance effect element 12a, resistance linearly changes with respect to an external magnetizing field (a magnetizing field from the current to be measured) in the stripe width direction perpendicular to the stripe longitudinal direction D1, and it may be possible to reduce a hysteresis. In such a magnetoresistance effect element, owing to the ferromagnetic fixed layer 32a, the non-magnetic intermediate layer 36a, and the free magnetic layer 37a, a spin-valve configuration is adopted.

As an example of the film configuration of the magnetoresistance effect element 12a used in the current sensor 1 according to the present embodiment, for example, NiFeCr (the seed layer 31a: 5 nm)/Fe70Co30 (the first ferromagnetic film 33a: 1.65 nm)/Ru (the antiparallel coupling film 34a: 0.4 nm)/Co90Fe10 (the second ferromagnetic film 35a: 2 nm)/Cu (the non-magnetic intermediate layer 36a: 2.2 nm)/Co90Fe10 (the free magnetic layer 37a: 1 nm)/Ni81Fe19 (the free magnetic layer 37a: 7 nm)/Ta (the protective layer 38a: 5 nm) may be cited.

Figure 4:
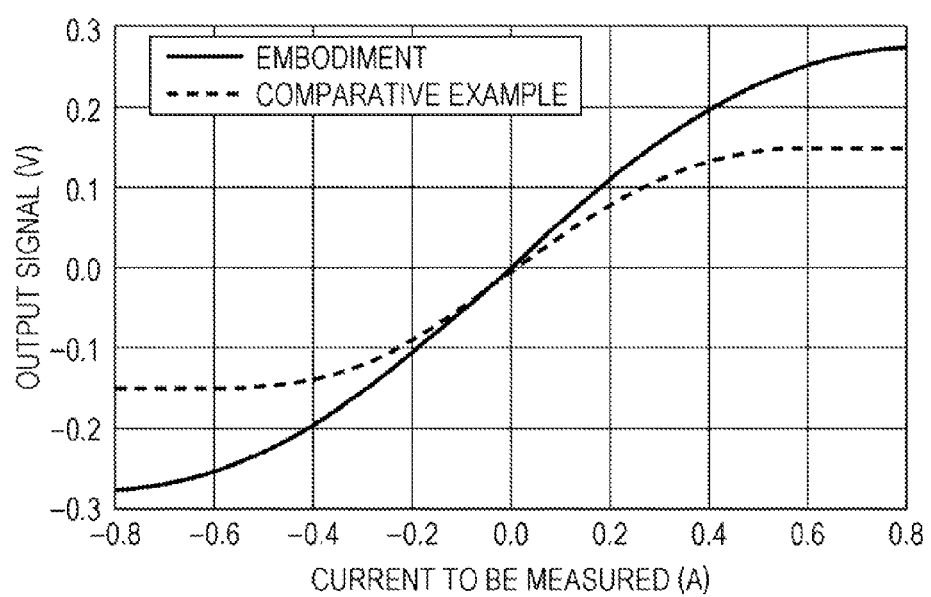
FIG. 4 is a diagram illustrating a relationship between a current to be measured and an output signal in each of a current sensor according to an embodiment of the present invention and a current sensor according to a comparative example.
Figure 7:
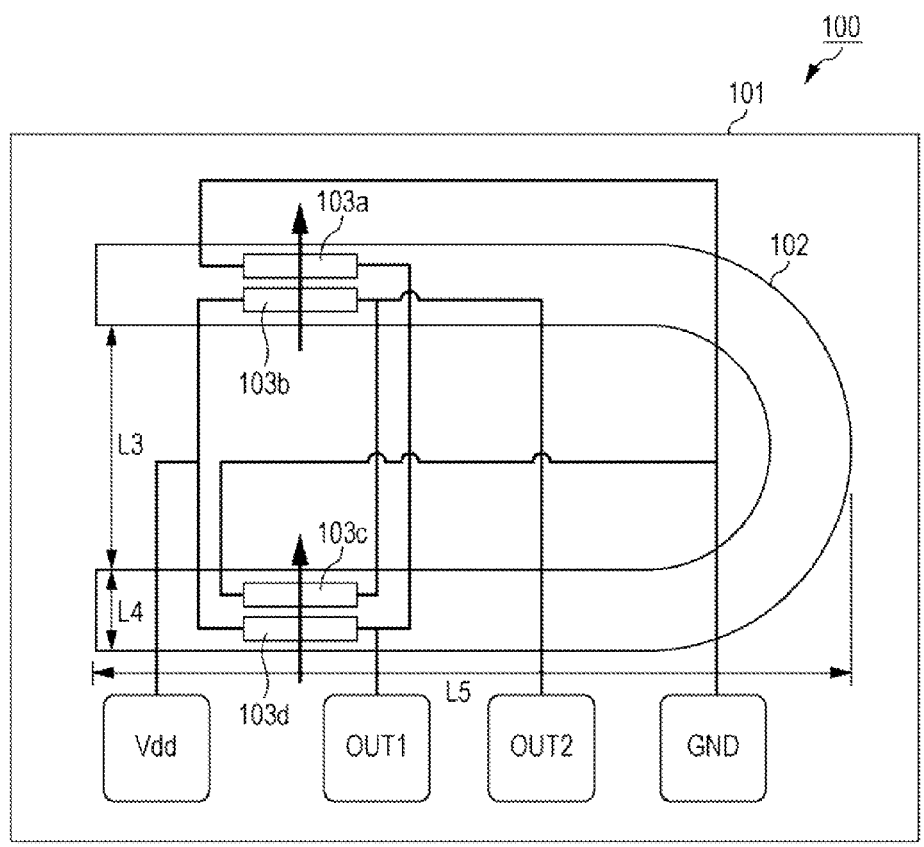
FIG. 7 is a diagram illustrating an example of a current drawing type current sensor.

Here, the present inventors studied linearity between the magnitude of the current to be measured in the current sensor 1 according to the present embodiment and an output signal from the magnetic field detection bridge circuit. The result is illustrated in FIG. 4. In addition, as a comparative example, linearity between the magnitude of the current to be measured in the current sensor 100 according to the comparative example including the U-shaped conductive body 102 illustrated in FIG. 7 and an output signal from the magnetic field detection bridge circuit was studied. The result is written side by side in FIG. 4. In addition, in the measurement result illustrated in FIG. 4, a horizontal axis indicates the magnitude of the current to be measured, and a vertical axis indicates the magnitude of the output signal output from the magnetic field detection bridge circuit in response to the magnitude of the current to be measured. In addition, the output signal of the current sensor 1 according to the present embodiment is indicated by a solid line, and the output signal of the current sensor 100 according to the comparative example is indicated by a dotted line.

In the example illustrated in FIG. 4, in the current sensor 1 according to the embodiment, it was assumed that Cu is used as the conductive body 13, a film thickness is 3 µm, a length in a width direction L1 is 130 µm, and a length in a longitudinal direction L2 is 1000 µm. In addition, it was assumed that a distance between the conductive body 13 and the magnetoresistance effect elements 12a to 12d is 1 µm. In addition, in the current sensor 100 according to the comparative example, it was assumed that Cu is used as the conductive body 102, a film thickness is 3 µm, a distance L3 between one end portion and the other end portion is 300 µm, the width L4 of each of the one end portion and the other end portion is 130 µm, and a length in a longitudinal direction L5 is 1000 µm. In addition, it was assumed that a distance between the conductive body 102 and the GMR elements 103a to 103d is 1 µm.

As will be understood from FIG. 4, in the current sensor 1 according to the above-mentioned embodiment, linearity between the magnitude of the current to be measured and the magnetic field detection bridge circuit is improved. In particular, it is understood that good linearity is obtained in a range of the current to be measured from −0.4 A to +0.4 A. On the other hand, in the current sensor 100 according to the comparative example where the conductive line conducting therethrough the current to be measured has a U-shape in planar view, it is understood that output linearity between the current to be measured and the output signal is lowered.

Next, using FIGS. 5A to 5C and FIGS. 6A to 6C, a manufacturing method for the current sensor 1 according to an embodiment of the present invention will be described. In the manufacturing method for the current sensor 1 according to the present embodiment, first, over the aluminum oxide film 22, the first laminated film of the magnetoresistance effect element 12a is formed that includes the self-pinned type ferromagnetic fixed layer 32 formed by antiferromagnetically coupling the first ferromagnetic film 33 and the second ferromagnetic film 35 through the antiparallel coupling film 34, the non-magnetic intermediate layer 36, and the free magnetic layer 37 and has a sensitivity axis direction in a specific direction (a first formation process), the first laminated film located in a region other than a region where the first laminated film is caused to remain is removed from the aluminum oxide film 22 (a removing process), and, over the aluminum oxide film 22 from which the first laminated film has been removed, the second laminated film of the magnetoresistance effect element 12b is formed that includes the self-pinned type ferromagnetic fixed layer 32 formed by antiferromagnetically coupling the first ferromagnetic film 33 and the second ferromagnetic film 35 through the antiparallel coupling film 34, the non-magnetic intermediate layer 36, and the free magnetic layer 37 and has a sensitivity axis direction in a direction antiparallel to the above-mentioned specific direction (a second formation process). Accordingly, it may be possible to provide, above the same substrate 11, the magnetoresistance effect elements 12a and 12b, in which the magnetization directions of the ferromagnetic fixed layers 32 and 32 are different, so that the magnetoresistance effect elements 12a and 12b are adjacent to each other. In addition, by repeatedly performing the removing process and the second formation process, described above, as illustrated in FIGS. 6A to 6C, it may be possible to provide, above the same substrate 11, the plural magnetoresistance effect elements 12a to 12d, in which the magnetization directions of the ferromagnetic fixed layers 32 are different, so that the plural magnetoresistance effect elements 12a to 12d are adjacent to each other.

FIGS. 5A to 5C and FIGS. 6A to 6C are explanatory diagrams for a manufacturing method for the magnetoresistance effect elements 12a to 12d in the current sensor 1 according to the present embodiment. In the manufacturing method for the current sensor 1 according to the present embodiment, after the magnetoresistance effect elements 12a and 12c have been formed, the magnetoresistance effect elements 12b and 12d are formed. First, as illustrated in FIG. 5A, on or over the aluminum oxide film 22, a seed layer 31, the first ferromagnetic film 33, the antiparallel coupling film 34, the second ferromagnetic film 35, the non-magnetic intermediate layer 36, the free magnetic layer 37, and a protective layer 38 are sequentially formed. During the film formation of the first ferromagnetic film 33 and the second ferromagnetic film 35, a magnetizing field is applied in the stripe width direction of the meander shape. In FIGS. 5A to 5C, as for the first ferromagnetic film 33 (Pin1), the direction of the applied magnetizing field is a direction headed from the far side of the plane of paper to the near side thereof, and as for the second ferromagnetic film 35 (Pin2), the direction of the applied magnetizing field is a direction headed from the near side of the plane of paper to the far side thereof. In this regard, however, as for the second ferromagnetic film 35, it may not be necessary to apply a magnetizing field in this direction. The magnetizing field may also be applied in the same direction as the first ferromagnetic film 33, and no magnetizing field may also be applied. The reason is that exchange coupling functions through the antiparallel coupling film 34 and a magnetization direction is continuously fixed in a direction antiparallel to the first ferromagnetic film 33. In this case, the film thickness optimization of the antiparallel coupling film 34 and coincidence in Ms·t of the first ferromagnetic film 33 and the second ferromagnetic film 35 may be important. In addition, during the film formation of the free magnetic layer 37, a magnetizing field is applied in the stripe longitudinal direction of the meander shape.

Next, as illustrated in FIG. 5B, the resist layer 40 is formed on the protective layer 38, and the resist layer 40 is caused to remain on the regions of the magnetoresistance effect elements 12a and 12c, owing to photolithography and etching. Next, as illustrated in FIG. 5C, owing to ion milling or the like, an exposed laminated film is removed, and the aluminum oxide film 22 is caused to be exposed that is located in regions where the magnetoresistance effect elements 12b and 12d are to be provided.

Figure 6A:
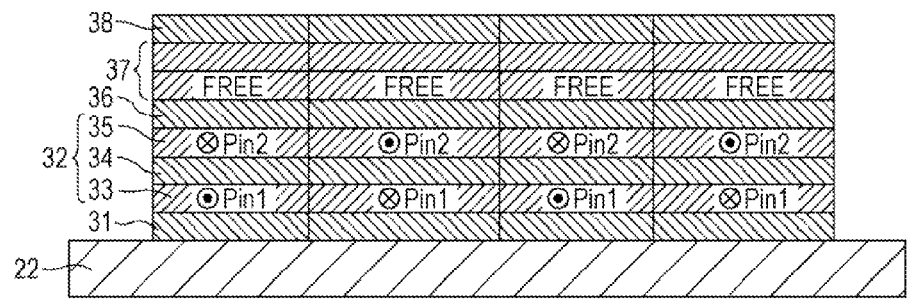
FIGS. 6A to 6C are explanatory diagrams for a manufacturing method for a current sensor according to an embodiment of the present invention.
Figure 6B:
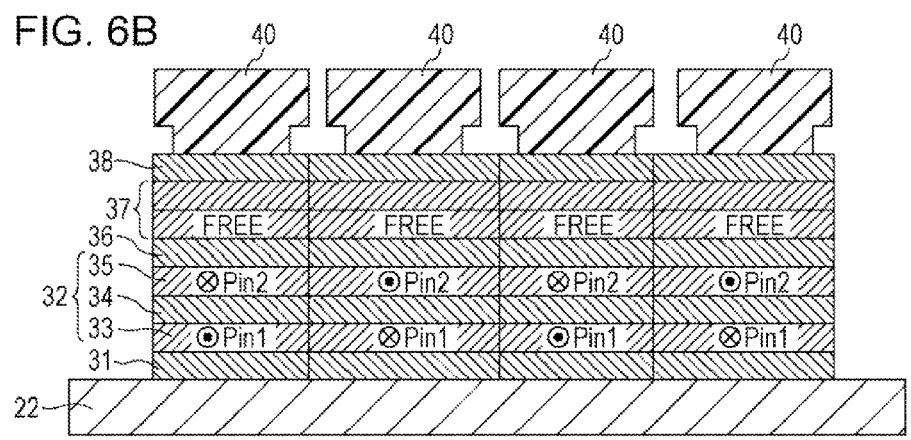
Figure 6C:
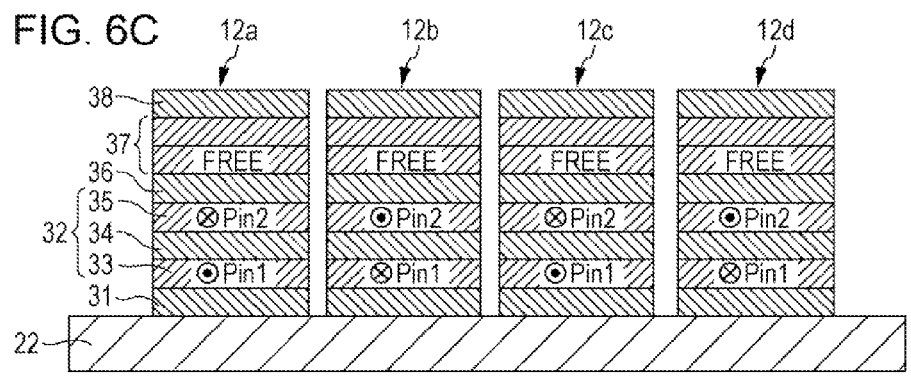

Next, as illustrated in FIG. 6A, after the resist layer 40 has been removed, the seed layer 31, the first ferromagnetic film 33, the antiparallel coupling film 34, the second ferromagnetic film 35, the non-magnetic intermediate layer 36, the free magnetic layer 37, and the protective layer 38 are sequentially formed on or over the exposed aluminum oxide film 22. During the film formation of the first ferromagnetic film 33 and the second ferromagnetic film 35, a magnetizing field is applied in the stripe width direction of the meander shape. In FIGS. 6A to 6C, as for the first ferromagnetic film 33 (Pin1), the direction of the applied magnetizing field is a direction headed from the near side of the plane of paper to the far side thereof, and as for the second ferromagnetic film 35 (Pin2), the direction of the applied magnetizing field is a direction headed from the far side of the plane of paper to the near side thereof. In addition, during the film formation of the free magnetic layer 37, a magnetizing field is applied in the stripe longitudinal direction of the meander shape.

Next, as illustrated in FIG. 6B, the resist layer 40 is formed on the protective layer 38, and the resist layer 40 is caused to remain on the forming regions of the magnetoresistance effect elements 12a, 12b, 12c, and 12d, owing to photolithography and etching. Next, as illustrated in FIG. 6C, owing to ion milling or the like, an exposed laminated film is removed, and the magnetoresistance effect elements 12a, 12b, 12c, and 12d are formed so as to be disposed in such a way as illustrated in FIG. 1.

According to such a manufacturing method for a current sensor, since no level difference occurs in the manufacturing of the magnetoresistance effect elements 12a to 12d, wiring lines may be easily formed, and an additional process such as increasing of the thickness of a wiring line or through-hole formation may become unnecessary. Therefore, it may be possible to easily manufacture a current sensor formed by providing, above the same substrate 11, the plural magnetoresistance effect elements 12a to 12d, whose sensitivity axis directions are individually different, so that the magnetoresistance effect elements 12a to 12d are adjacent to each other.

As described above, in the current sensor according to the above-mentioned embodiment, since the self-pinned type magnetoresistance effect element is provided, it may be possible to fix the magnetization direction of the ferromagnetic fixed layer in an arbitrary direction with no antiferromagnetic layer provided. Therefore, even if four magnetoresistance effect elements are arranged in parallel on or above a substrate, it may be possible to fix the magnetization direction of the ferromagnetic fixed layer of each magnetoresistance effect element in an arbitrary direction. Accordingly, even if the conductive body extending in one direction is used, it may become possible to measure a current to be measured. Therefore, it may be possible to reduce the area of the substrate, and it may be possible to realize the downsizing of the current sensor and the reduction of a manufacturing cost.

In addition, in the current sensor according to the above-mentioned embodiment, the current to be measured is conducted through the conductive body extending in one direction. Therefore, it may be possible to suppress the interference of an induction magnetic field from the current to be measured, and it may be possible to suppress the occurrence of an induced electromotive force with respect to a disturbance magnetic field. Accordingly, it may be possible to improve the measurement accuracy and the measurement range of the current sensor.

Since, in particular, in the current sensor according to the above-mentioned embodiment, the conductive body extending in one direction is used, it may be possible to align the applying directions of the induction magnetic field from the current to be measured, and hence, it may become possible to reduce the interference of the induction magnetic field. In addition, since it may be possible to suppress the occurrence of an induced electromotive force with respect to the disturbance magnetic field, it may be possible to reduce the influence of the disturbance magnetic field. From these, it may become possible to improve the measurement accuracy and the measurement range of the current to be measured.

In addition, since, in the current sensor according to the above-mentioned embodiment, the conductive body extending in one direction is used, it may be possible to reduce the resistance of the conductive body compared with a case where a conductive body having an inflected shape is used. Therefore, it may be possible to suppress the loss of the current to be measured and heat generation due to the conduction of the current to be measured.

Furthermore, since, in the current sensor according to the above-mentioned embodiment, the self-pinned type magnetoresistance effect element is used, it may be possible to configure the magnetoresistance effect element using no antiferromagnetic material. Accordingly, even under a high-temperature environment, it may be possible to secure the stability of the operation of the current sensor 1 and configure the magnetic field detection bridge circuit using no fixed resistance element. Therefore, it may be possible to reduce an offset. In addition, since a material cost is reduced owing to the use of no antiferromagnetic material or an annealing treatment in a magnetizing field becomes unnecessary, it may be possible to reduce a manufacturing cost.

In addition, since, in the current sensor according to the above-mentioned embodiment, the magnetic detection bridge circuit is configured owing to the four magnetoresistance effect elements whose film configurations are the same, it may be possible to greatly reduce the shift of a zero-magnetizing field resistance value (R0) or a temperature coefficient resistivity (TCR0) between elements. Therefore, it may be possible to reduce the variation of a midpoint potential regardless of an ambient temperature, and it may be possible to perform current measurement with a high degree of accuracy. In addition, since, in the current sensor according to the above-mentioned embodiment, the magnetoresistance effect element includes no antiferromagnetic material, it may be possible to reduce a material cost or a manufacturing cost.

The present invention is not limited to the above-mentioned embodiment, and may be implemented with being variously modified. For example, a material, a connection relationship between individual elements, a thickness, a size, a manufacturing method, or the like in the above-mentioned embodiment may be variously modified to implement the present invention.

For example, in the current sensor according to the above-mentioned embodiment, a case has been described where the conductive body having the substantially rectangular shape in planar view is used. However, if being a shape capable of conducting the current to be measured in one direction, the shape of the conductive body is not limited to the rectangular shape, and may be arbitrarily changed. For example, a conductive body having an inflected shape may also be used insofar as the advantageous effect of the present invention is obtained. In addition, the present invention may be arbitrarily changed and implemented within the scope of the present invention.

The present invention has an advantageous effect that it may be possible to extensively and precisely measure a current to be measured and downsizing is available, and, in particular, the present invention may be applied to various kinds of current sensors or a current sensor detecting the magnitude of a current used for driving a motor in an electric vehicle.

What is claimed is:

1. A current sensor comprising:
   a substrate;
   a conductive body extending in a first direction and configured to flow a current to be measured therethrough, the conductive body being provided above the substrate; and
   at least two magnetoresistance effect elements arranged in parallel between the substrate and the conductive body, the magnetoresistance effect elements outputting an output signal based on an induction magnetic field from the current to be measured, each of the magnetoresistance effect elements having a laminated structure including:
      a ferromagnetic fixed layer whose magnetization direction is fixed,
      a non-magnetic intermediate layer, and
      a free magnetic layer whose magnetization direction varies in accordance with an external magnetic field,
   wherein the ferromagnetic fixed layer is a self-pinned type in which a first ferromagnetic film and a second ferromagnetic film are antiferromagnetically coupled to each other with an antiparallel coupling film interposed therebetween, Curie temperatures of the first ferromagnetic film and the second ferromagnetic film are substantially the same, and a magnetization amount of the first ferromagnetic film and a magnetization amount of the second ferromagnetic film are substantially the same,
   and wherein a direction in which the magnetoresistance effect elements are arranged in parallel is substantially the same as the first direction in which the conductive body extends.

2. The current sensor according to claim 1, wherein a cross-section of the conductive body in a direction perpendicular to the first direction has a rectangular shape.

3. The current sensor according to claim 1, wherein the magnetoresistance effect elements are overlaid by the conductive body extending in the first direction.

4. The current sensor according to claim 1, further comprising:
   a magnetic field detection bridge circuit including the at least two magnetoresistance effect elements, and two outputs producing therebetween a voltage difference corresponding to the induction magnetic field,
   wherein the current to be measured is measured based on the voltage difference output from the magnetic field detection bridge circuit in accordance with the induction magnetic field.

5. The current sensor according to claim 1, further comprising:
   a magnetic field detection bridge circuit including:
      a first pair of the magnetoresistance effect elements in which the magnetization directions of the ferromagnetic fixed layers are fixed in a second direction;
      a second pair of the magnetoresistance effect elements in which the magnetization directions of the ferromagnetic fixed layers are fixed in a third direction opposite to the second direction; and two outputs producing therebetween a voltage difference corresponding to the induction magnetic field,
   wherein the current to be measured is measured based on the voltage difference output from the magnetic field detection bridge circuit in accordance with the induction magnetic field.

* * * * *